United States Patent

Shiu

(10) Patent No.: US 8,822,104 B2
(45) Date of Patent: Sep. 2, 2014

(54) PHOTOMASK

(75) Inventor: Wei-Cheng Shiu, Taoyuan County (TW)

(73) Assignee: Nanya Technology Corporation, Taoyuan (TW)

( * ) Notice: Subject to any disclaimer, the term of this patent is extended or adjusted under 35 U.S.C. 154(b) by 324 days.

(21) Appl. No.: 13/327,773

(22) Filed: Dec. 16, 2011

(65) Prior Publication Data

US 2013/0157176 A1  Jun. 20, 2013

(51) Int. Cl.
*G03F 1/36* (2012.01)

(52) U.S. Cl.
USPC .............................................. 430/5

(58) Field of Classification Search
CPC ......................................... G03F 1/36
USPC .............................................. 430/5
See application file for complete search history.

(56) References Cited

U.S. PATENT DOCUMENTS

| 6,887,625 | B2 | 5/2005 | Baselmans et al. |
| 2004/0172610 | A1 | 9/2004 | Liebmann et al. |
| 2006/0008709 | A1 | 1/2006 | Kushida et al. |
| 2007/0141479 | A1* | 6/2007 | Misaka ............................. 430/5 |
| 2007/0196745 | A1* | 8/2007 | Kamijima et al. ............... 430/5 |
| 2009/0296055 | A1 | 12/2009 | Ye et al. |

FOREIGN PATENT DOCUMENTS

| CN | 1549053 | 11/2004 |
| CN | 1673867 | 9/2005 |
| CN | 101329505 | 12/2008 |
| JP | 2006-019577 | 1/2006 |

* cited by examiner

*Primary Examiner* — Mark F Huff
*Assistant Examiner* — John S Ruggles
(74) *Attorney, Agent, or Firm* — Jianq Chyun IP Office

(57) ABSTRACT

A photomask is provided. The photomask is applied to a photolithography apparatus and includes a substrate with a mask pattern disposed thereon. The mask pattern includes at least one main pattern and a plurality of sub-resolution assistant features (SRAFs). The SRAFs are disposed around the at least one main pattern and separated from each other, wherein a distance between each of the SRAFs and the at least one main pattern is about 3 to 10 times a linewidth of the at least one main pattern. The photomask would result in an improved imaging quality on the wafer.

10 Claims, 4 Drawing Sheets

PHOTOMASK

BACKGROUND OF THE INVENTION

1. Field of Invention

The present invention relates to a photomask, and more generally to a photomask for imaging quality improvement caused by lens aberration under extreme illumination.

2. Description of Related Art

In recent years, the trend in the development of semiconductor is toward miniaturization of circuit devices. Photolithography plays a key role in such a miniaturization development for semiconductor industry because it determines the critical dimension (CD) of a thin film pattern related to semiconductor device structures. Thus, the accuracy of a photomask pattern transfer is very important. If the pattern transfer is inaccurate, the tolerance of the critical dimension on the chip can be affected and the resolution of the exposure can be reduced.

However, due to the absorption of energy for lens when light passes through the scanner, the lens is subject to uneven thermal expansion because diffraction patterns are not distributed uniformly. Images deform due to lens aberration, and the imaging quality is accordingly reduced. The above-mentioned problem becomes more serious when the illumination uses a strong off-axis illumination (OAI) such as a dipole illuminator.

SUMMARY OF THE INVENTION

The present invention provides a photomask to effectively improve the imaging quality deterioration caused by lens aberration.

The present invention provides a photomask. The photomask is applied to a photolithography apparatus and includes a substrate and a mask pattern disposed on the substrate. The mask pattern includes at least one main pattern and a plurality of sub-resolution assistant features (SRAFs). The SRAFs are disposed around the at least one main pattern and separated from each other, wherein a first distance between each of the SRAFs and the at least one main pattern is about 3 to 10 times a first linewidth of the at least one main pattern.

Accordingly to an embodiment of the present invention, a second linewidth for each of the SRAFs is one-quarter to one-tenth of the first linewidth of the at least one main pattern.

Accordingly to an embodiment of the present invention, the second linewidth for each of the SRAFs is one-quarter to one-fifth of the first linewidth of the at least one main pattern.

Accordingly to an embodiment of the present invention, a second distance between two neighboring SRAFs is about 5 to 10 times a second linewidth for each of the SRAFs.

Accordingly to an embodiment of the present invention, when the photomask includes a plurality of main patterns, the SRAFs are located between two neighboring main patterns.

Accordingly to an embodiment of the present invention, the SRAFs are located at centered positions between the two neighboring main patterns.

Accordingly to an embodiment of the present invention, the main patterns are arranged in an array.

Accordingly to an embodiment of the present invention, the SRAFs are arranged in an array.

Accordingly to an embodiment of the present invention, the mask pattern is a transparent region or a semi-transparent region on the substrate.

Accordingly to an embodiment of the present invention, a region other than the mask pattern is a non-transparent region on the substrate.

In view of the foregoing, in the photomask of the present invention, a plurality of SRAFs are disposed around at least one main pattern, and the first distance between each of the SRAFs and the at least one main pattern is about 3 to 10 times the first linewidth of the main pattern. Therefore, diffraction patterns are distributed more uniformly. Accordingly, the lens is subject to even thermal expansion, so that the obtained images on the wafer have improved imaging quality. It is noted that original optical system resolution is not impacted by such SRAFs. It means that the normalized image log slope (NILS) would not then be impacted with such SRAFs existed if not counting lens aberration.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
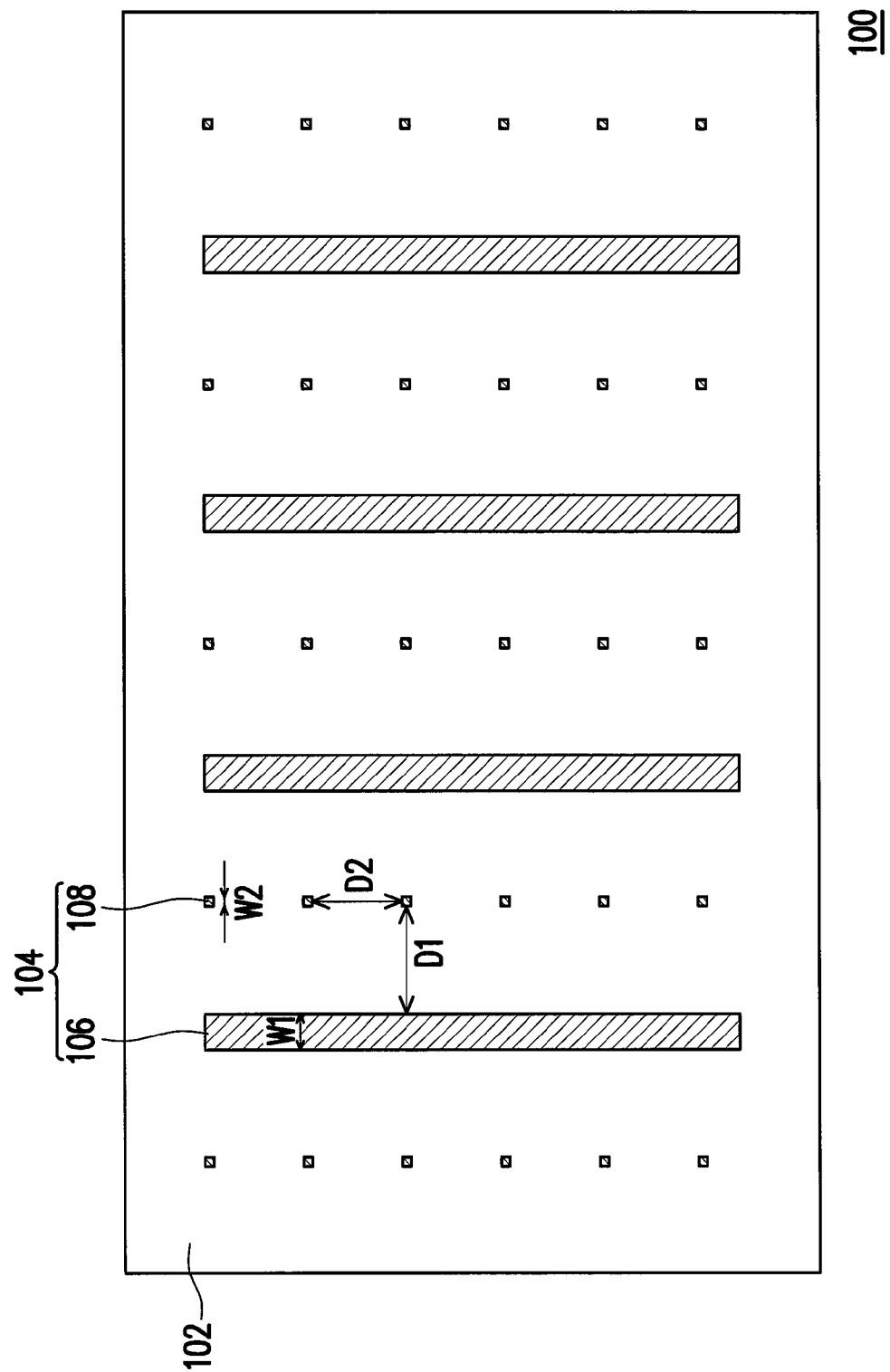
FIG. 1 schematically illustrates a photomask according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Figure 2:
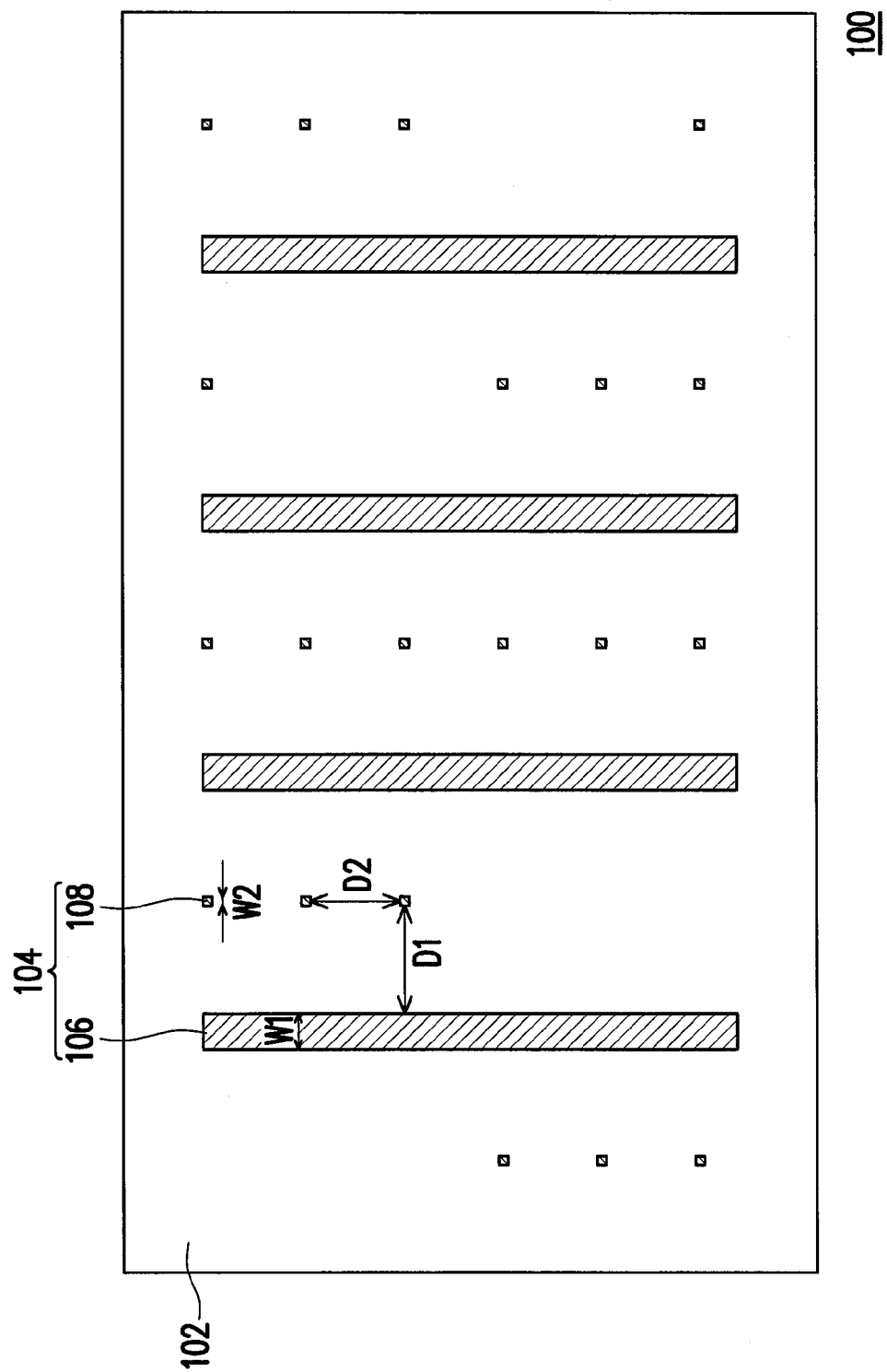
FIG. 2 schematically illustrates a photomask according to another embodiment of the present invention.
Figure 3:
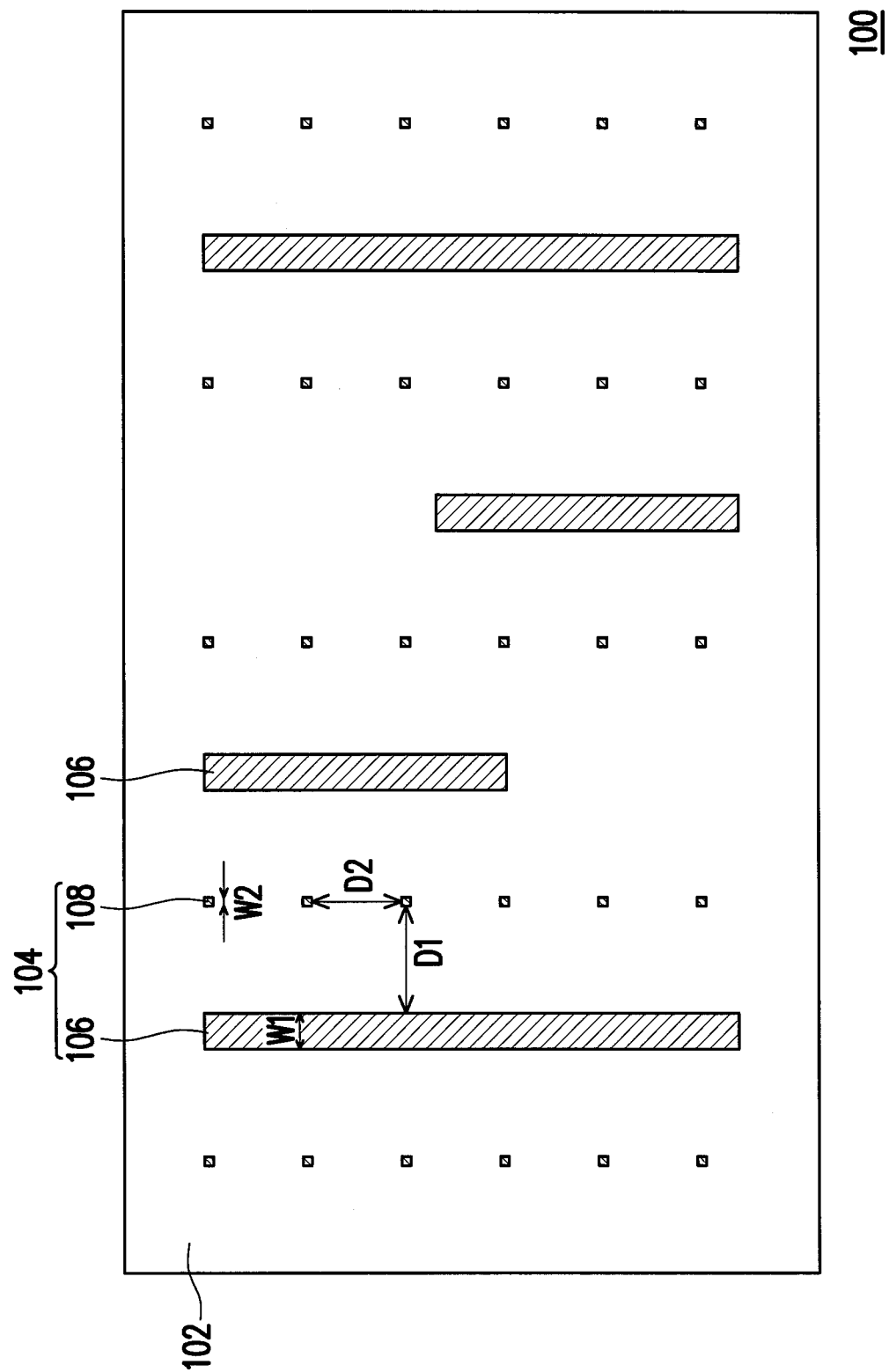
FIG. 3 schematically illustrates a photomask according to yet another embodiment of the present invention.
Figure 4:
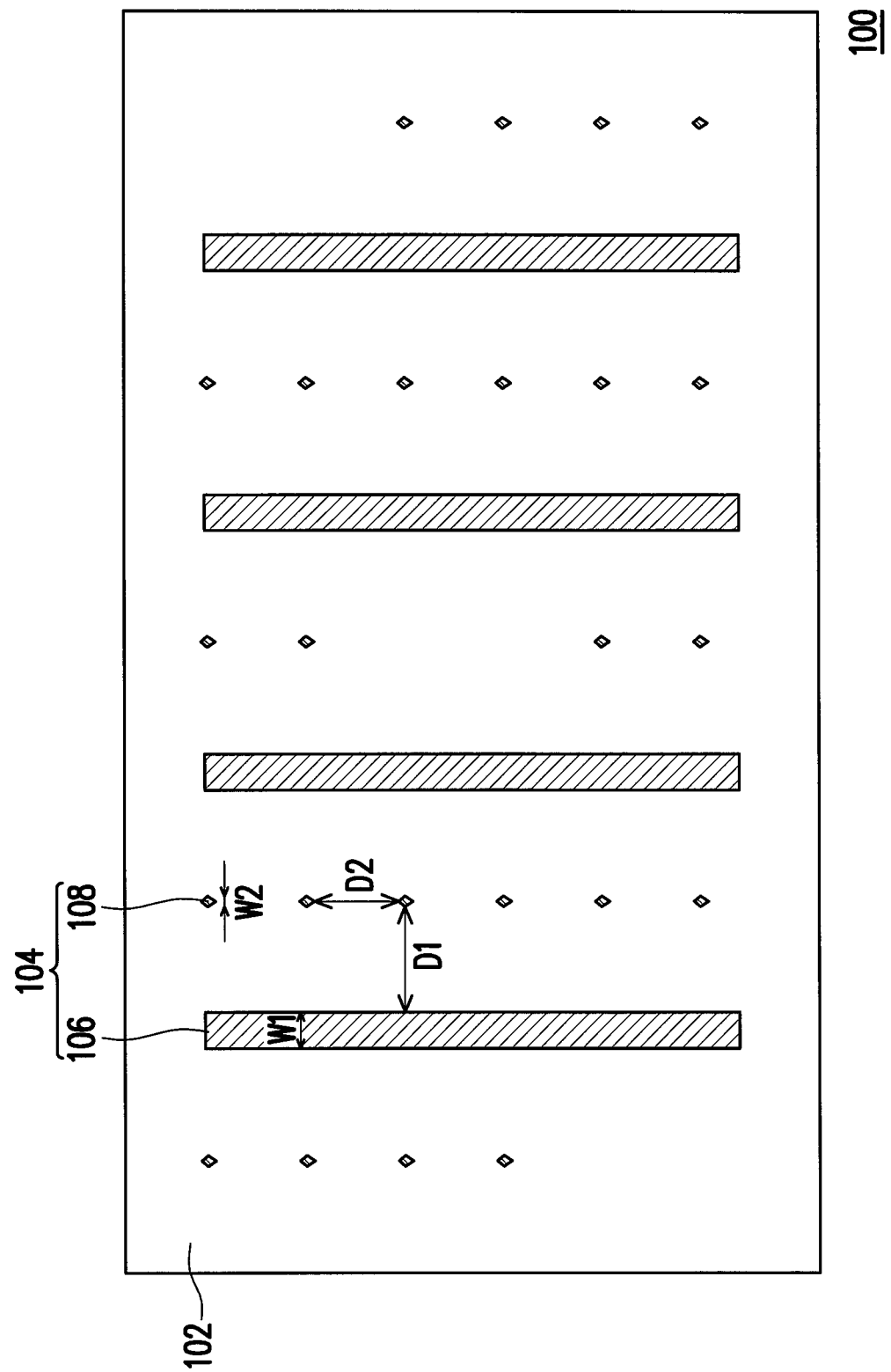
FIG. 4 schematically illustrates a photomask according to still another embodiment of the present invention.

FIG. 1 schematically illustrates a photomask according to an embodiment of the present invention. FIG. 2 to FIG. 4 each schematically illustrates a photomask according to another embodiment of the present invention.

Referring to FIG. 1, a photomask 100 is applied to a photolithography apparatus. The photomask 100 includes a substrate 102 and a mask pattern 104 disposed on the substrate 102. The mask pattern 104 is a transparent region or a semi-transparent region on the substrate 102. A region other than the mask pattern 104 is a non-transparent region on the substrate 102.

The mask pattern 104 includes at least one main pattern 106 and a plurality of sub-resolution assistant features (SRAFs) 108. The linewidth W1 of the main pattern 106 is less than 100 nm, for example. The main pattern 106 has a stripe shape, but the present invention is not limited thereto. In addition, the shapes and linewidths of these main patterns 106 can be the same or different from each other. The shapes and linewidths of respective main patterns 106 can be adjusted by persons skilled in the art according to the actual design requirements.

The SRAFs 108 separated from each other are disposed around the single main pattern 106, and the distance D1 between each of the SRAFs 108 and the main pattern 106 is about 3 to 10 times the linewidth W1 of the main pattern 106. Such design helps to improve the uniformity of diffraction patterns. The SRAFs 108 can be nano-sized, size flexible, arbitrary shape or non NILS-impacted SRAFs.

Each SRAF 108 has a small linewidth W2 such that each SRAF 108 is non-imageable. The linewidth W2 for each of the SRAFs 108 is about one-quarter to one-tenth of the linewidth W1 of the main pattern 106, for example. Further, the linewidth W2 for each of the SRAFs 108 can be one-quarter to one-fifth of the linewidth W1 of the main pattern 106. This embodiment in which each SRAF 108 is rectangular is provided for illustration purposes, and is not construed as limiting the present invention. Besides, the shapes and linewidths of the SRAFs 108 can be the same as or different from each other. The shapes and linewidths of respective SRAFs 108 can be adjusted by persons skilled in the art according to the actual design requirements.

The distance D2 between two neighboring SRAFs 108 is about 5 to 10 times the linewidth W2 for each of the SRAFs 108. Such design can further help to improve the uniformity of diffraction patterns.

The plurality of SRAFs 108 can be disposed at the same side or at both sides of the single main pattern 106, or disposed around the main patterns 106. In addition, the SRAFs 108 can be located between two neighboring main patterns 106. For examples, the SRAFs 108 can be located at centered positions between the two neighboring main patterns 106. Therefore, additional reticle space used to modify the imaging patterns is not necessary, and thus, the original used space of the photomask 100 is not affected.

This embodiment in which four main patterns 106 are arranged in an array and thirty SRAFs 108 are arranged in an array is provided for illustration purposes, and is not construed as limiting the present invention. As long as there are two or more SRAFs 108 disposed around one main pattern 106, the case belongs to the protection scope of the present invention. The number of the main patterns 106, the number of the SRAFs 108 and the arrangement types can be adjusted by persons skilled in the art upon the design requirements.

For example, referring to FIG. 2 and FIG. 4, the number of the SRAFs 108 at one side of the main pattern 106 can be different from the number of the SRAFs 108 at the other side of the main pattern 106. Besides, the SRAFs 108 can be arranged not in an array. As shown in FIG. 3, the shapes of the main patterns 106 can be different from each other, and the main patterns 106 can be arranged not in an array. In addition, unlike the square SRAFs 108 in FIGS. 1-3, the rhombus SRAFs 108 are used in FIG. 4.

In view of the said embodiment, a plurality of SRAFs 108 are disposed around at least one main pattern 106, and the distance D1 between each of the SRAFs 108 and the main pattern 106 is about 3 to 10 times the linewidth W1 of the main pattern 106. Therefore, diffraction patterns are distributed uniformly. Accordingly, the lens is subject to even thermal expansion, so that the obtained images on the wafer have improved imaging quality.

Besides, the distance D1 between each of the SRAFs 108 and the main pattern 106 is about 3 to 10 times the linewidth W1 of the main pattern 106. In such a manner, additional reticle space used to modify the imaging patterns is not required, and thus, the original used space of the photomask 100 is not affected.

In summary, the said embodiment at least provides the following features:

Firstly, the photomask of the said embodiment would result in an improved imaging quality on the wafer.

Secondly, when the photomask of the said embodiment is used, the original used space of the photomask is not affected.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A photomask, applied to a photolithography apparatus, where the photomask comprises a substrate and a mask pattern disposed on the substrate, the mask pattern comprising:
   at least one main pattern; and
   a plurality of sub-resolution assistant features (SRAFs), disposed around the at least one main pattern, and separated from each other, wherein a first distance between each of the SRAFs and the at least one main pattern is 3 to 10 times a first linewidth of the at least one main pattern.

2. The photomask of claim 1, a second linewidth for each of the SRAFs is one-quarter to one-tenth of the first linewidth of the at least one main pattern.

3. The photomask of claim 2, the second linewidth for each of the SRAFs is one-quarter to one-fifth of the first linewidth of the at least one main pattern.

4. The photomask of claim 1, wherein a second distance between two neighboring SRAFs is 5 to 10 times a second linewidth for each of the SRAFs.

5. The photomask of claim 1, wherein when the photomask comprises a plurality of main patterns, the SRAFs are located between two neighboring main patterns.

6. The photomask of claim 5, wherein the SRAFs are located at centered positions between the two neighboring main patterns.

7. The photomask of claim 5, wherein the main patterns are arranged in an array.

8. The photomask of claim 5, wherein the SRAFs are arranged in an array.

9. The photomask of claim 1, wherein the mask pattern is a transparent region or a semi-transparent region on the substrate.

10. The photomask of claim 1, wherein a region other than the mask pattern is a non-transparent region on the substrate.

* * * * *